(12) United States Patent
Murakami (10) Patent No.: US 10,334,740 B2
(45) Date of Patent: Jun. 25, 2019

(54) ELECTRONIC-COMPONENT MOUNT SUBSTRATE, ELECTRONIC DEVICE, AND ELECTRONIC MODULE

(71) Applicant: KYOCERA Corporation, Kyoto-shi, Kyoto (JP)

(72) Inventor: Kensaku Murakami, San Diego, CA (US)

(73) Assignee: Kyocera Corporation, Kyoto (JP)

( * ) Notice: Subject to any disclaimer, the term of this patent is extended or adjusted under 35 U.S.C. 154(b) by 135 days.

(21) Appl. No.: 15/689,313

(22) Filed: Aug. 29, 2017

(65) Prior Publication Data

US 2018/0116055 A1 Apr. 26, 2018

(30) Foreign Application Priority Data

Oct. 26, 2016 (JP) ................................ 2016-209705

(51) Int. Cl.
*H05K 1/18* (2006.01)
*H05K 3/34* (2006.01)
(Continued)

(52) U.S. Cl.
CPC ......... *H05K 3/3442* (2013.01); *H01L 23/315* (2013.01); *H01L 24/29* (2013.01); *H01L 24/75* (2013.01); *H05K 1/0206* (2013.01); *H05K 1/111* (2013.01); *H05K 1/141* (2013.01); *H05K 3/3405* (2013.01); *H01L 23/3107* (2013.01); *H01L 23/498* (2013.01); *H01L 24/13* (2013.01); *H01L 24/16* (2013.01); *H01L 24/32* (2013.01); *H01L 24/73* (2013.01); *H01L 24/92* (2013.01); *H01L 25/0655* (2013.01); *H01L 2224/131* (2013.01); *H01L 2224/13144* (2013.01); *H01L 2224/16227* (2013.01); *H01L 2224/32225* (2013.01); *H01L 2224/48227* (2013.01); *H01L 2224/73265* (2013.01); *H01L 2224/92247* (2013.01); *H01L 2924/14* (2013.01); *H01L 2924/15311* (2013.01); *H01L 2924/15313* (2013.01); *H01L 2924/19041* (2013.01);
(Continued)

(58) Field of Classification Search
CPC ...... H05K 1/181; H05K 3/303; H05K 1/0203; H01L 21/67144
See application file for complete search history.

(56) References Cited

U.S. PATENT DOCUMENTS

| | | | | |
|---|---|---|---|---|
| 5,326,937 A | * | 7/1994 | Watanabe | H05K 1/0215 174/262 |
| 5,453,580 A | * | 9/1995 | Franke | H05K 1/0271 174/250 |
| 2008/0105455 A1 | * | 5/2008 | Palfreyman | H05K 1/0271 174/254 |

FOREIGN PATENT DOCUMENTS

JP 2014-086630 A 5/2014

\* cited by examiner

*Primary Examiner* — Jeremy C Norris
(74) *Attorney, Agent, or Firm* — Volpe and Koenig, P.C.

(57) ABSTRACT

An electronic-component mount substrate includes a substrate having a first principal surface and a second principal surface opposite to the first principal surface; a mount electrode for mounting an electronic component on the first principal surface, the mount electrode having a first slit and sandwiching the first slit; a plane electrode surrounding the mount electrode in a plan view and having a second slit; a connection electrode connecting the mount electrode with the plane electrode; and an outer electrode on the second principal surface. The connection electrode overlaps the outer electrode and an outer edge of the outer electrode surrounds the connection electrode in a perspective plan view.

8 Claims, 11 Drawing Sheets

(51) Int. Cl.
  *H01L 23/00*    (2006.01)
  *H01L 23/31*    (2006.01)
  *H05K 1/11*     (2006.01)
  *H05K 1/02*     (2006.01)
  *H05K 1/14*     (2006.01)
  *H05K 3/30*         (2006.01)
  *H01L 23/498*       (2006.01)
  *H01L 25/065*       (2006.01)
(52) U.S. Cl.
  CPC ............... *H01L 2924/19105* (2013.01); *H01L 2924/3511* (2013.01); *H05K 3/301* (2013.01); *H05K 2201/049* (2013.01); *H05K 2201/09781* (2013.01); *H05K 2201/10606* (2013.01)

ELECTRONIC-COMPONENT MOUNT SUBSTRATE, ELECTRONIC DEVICE, AND ELECTRONIC MODULE

BACKGROUND OF THE INVENTION

1. Field of the Invention

The present invention relates to an electronic-component mount substrate, an electronic device, and an electronic module.

2. Description of the Related Art

An electronic-component mount substrate of related art includes a mount electrode on a first principal surface of a substrate, for mounting an electronic component; an outer electrode on a second principal surface of the substrate; and a via conductor connecting the mount electrode with the outer electrode. When an electronic device including the electronic component and the electronic-component mount substrate is joined to, for example, a module substrate, by using a joining material such as solder, the outer electrode is joined to the module substrate via the joining material such as solder (see Japanese Unexamined Patent Application Publication No. 2014-086630).

In recent years, the electronic device has been requested to be advanced in function and decreased in size. When the via conductor is connected to the mount electrode and overlaps a mount portion for the electronic component in a perspective plan view, heat generated from the electronic component and heat generated from the via conductor when electric current flows through the via conductor may be concentrated at a center portion of the substrate, possibly resulting in separation of the electronic component or breakage of the electronic component due to a warp of the electronic-component mount substrate.

SUMMARY OF THE INVENTION

According to an aspect of the present invention, an electronic-component mount substrate includes a substrate having a first principal surface and a second principal surface opposite to the first principal surface; a mount electrode for mounting an electronic component on the first principal surface, the mount electrode having a first slit and sandwiching the first slit; a plane electrode surrounding the mount electrode in a plan view and having a second slit; a connection electrode connecting the mount electrode with the plane electrode; and an outer electrode on the second principal surface. The connection electrode overlaps the outer electrode and an outer edge of the outer electrode surrounds the connection electrode in a perspective plan view. With this configuration, for example, when the plane electrode is connected to the outer electrode through a via conductor, transfer of heat of the via conductor by a large amount to the electronic component through the connection electrode is suppressed, and the heat is more likely transferred to the outer electrode rather than the connection electrode. Accordingly, a warp of the electronic-component mount substrate can be suppressed, and separation of the electronic component or breakage of the electronic component can be suppressed.

According to another aspect of the present invention, an electronic device includes the electronic-component mount substrate with the above-described configuration; and an electronic component mounted on the electronic-component mount substrate. Accordingly, electrical reliability is increased.

According to still another aspect of the invention, an electronic module includes the electronic device with the above-described configuration; and a module substrate with the electronic device connected thereto. Accordingly, reliability is good for a long term.

DESCRIPTION OF THE PREFERRED EMBODIMENTS

Some exemplary embodiments of the present invention are described with reference to the accompanying drawings.

First Embodiment

An electronic device according to a first embodiment of the present invention includes an electronic-component mount substrate 1 and an electronic component 2 on a principal surface of the electronic-component mount substrate 1 as an example illustrated in FIGS. 1A to 4. The electronic device is connected to a connection pad 51 on a module substrate 5 forming an electronic module by using a joining material 6 as the example illustrated in FIG. 4.

The electronic-component mount substrate 1 according to this embodiment includes a substrate 11 having a first principal surface and a second principal surface opposite to the first principal surface; a mount electrode 12 for mounting the electronic component 2 on the first principal surface, the mount electrode 12 having a first slit 12*a* and sandwiching the first slit 12*a*; a plane electrode 13 surrounding the mount electrode 12 in a plan view and having a second slit 13*a*; a connection electrode 14 connecting the mount electrode 12 with the plane electrode 13; and an outer electrode 15 on the second principal surface. A via conductor 16 is in the substrate 11. The connection electrode 14 overlaps the outer electrode 15 and an outer edge of the outer electrode 15 surrounds the connection electrode 14 in a perspective plan view. In FIGS. 1A to 3B, the electronic device is mounted on an xy plane in an imaginary xyz space. In FIGS. 1A to 3B, an upward direction represents a positive direction along an imaginary z axis. In the following description, the discrimination between the upper and lower sides is merely for the convenience, and it is not intended to limit the upper and lower sides when the electronic-component mount substrate 1 and other members are actually used.

Figure 1A:
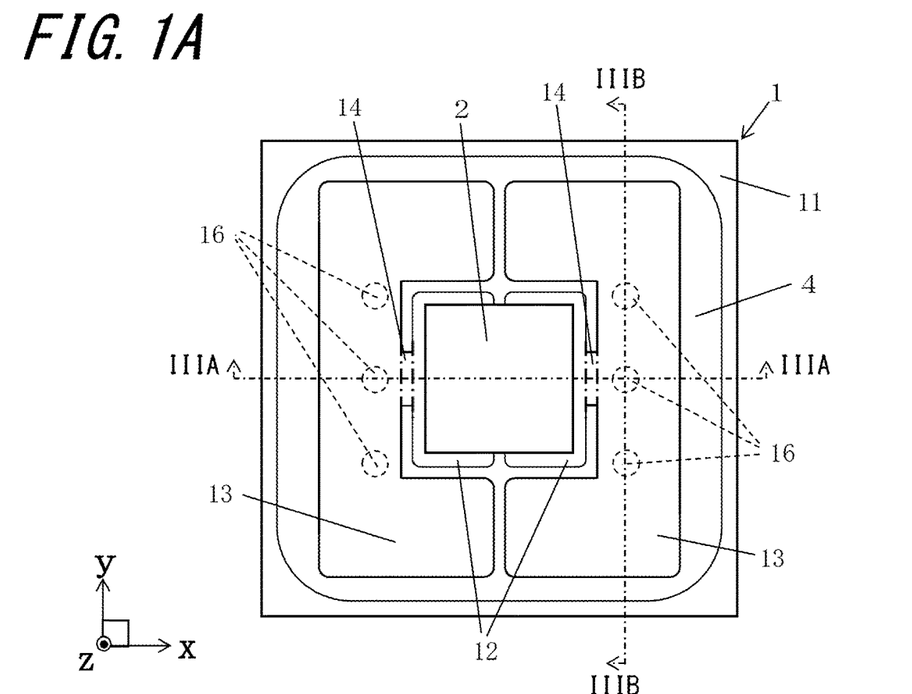
FIG. 1A is a top view illustrating an electronic device according to a first embodiment of the present invention.
Figure 1B:
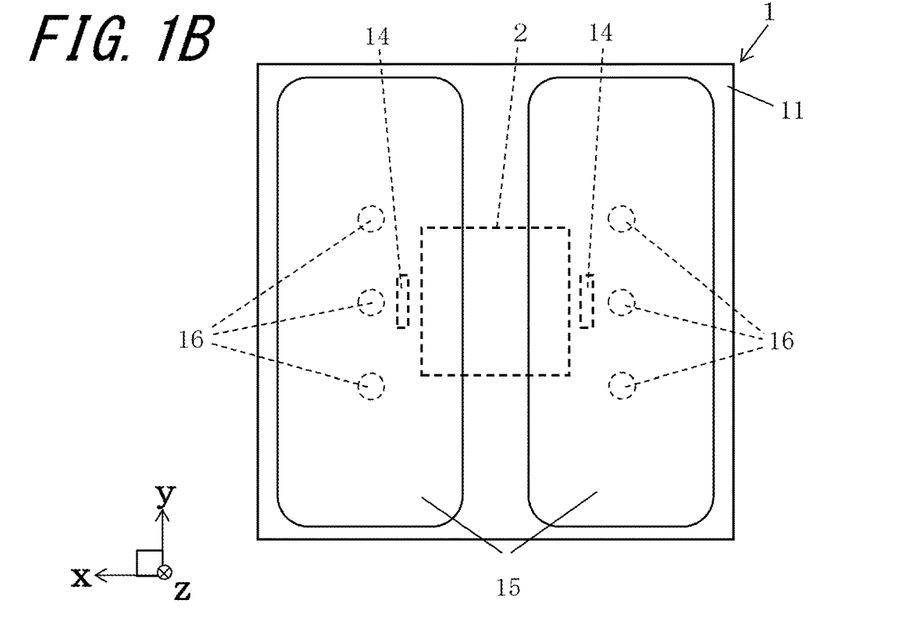
FIG. 1B is a bottom view of FIG. 1A.
Figure 2A:
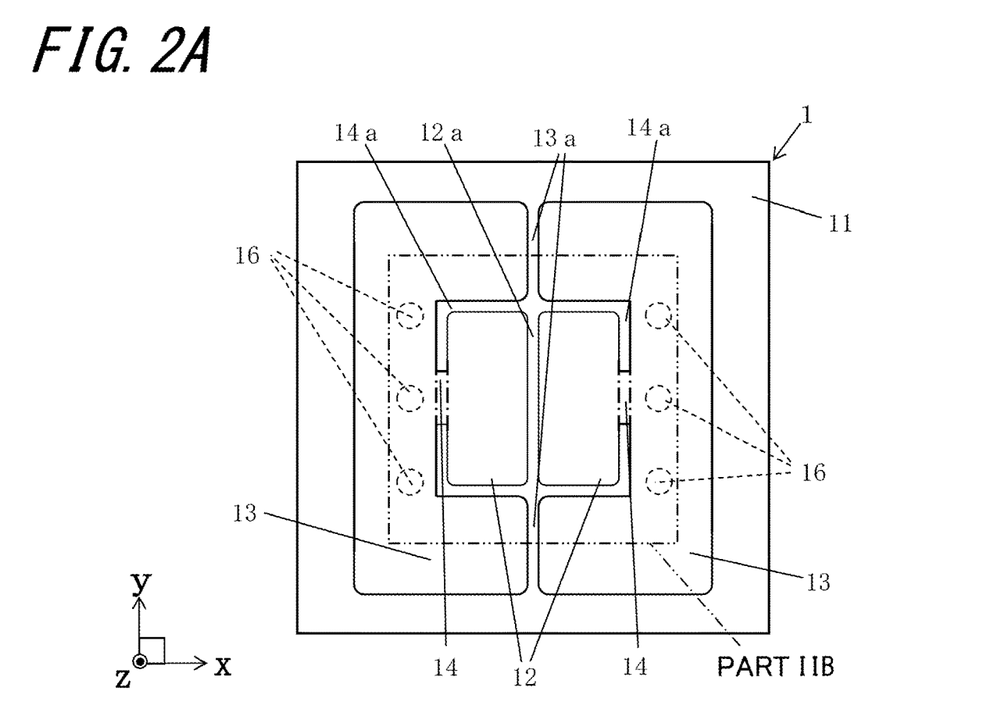
FIG. 2A is a top view illustrating an electronic-component mount substrate in the electronic device in FIGS. 1A and 1B.
Figure 2B:
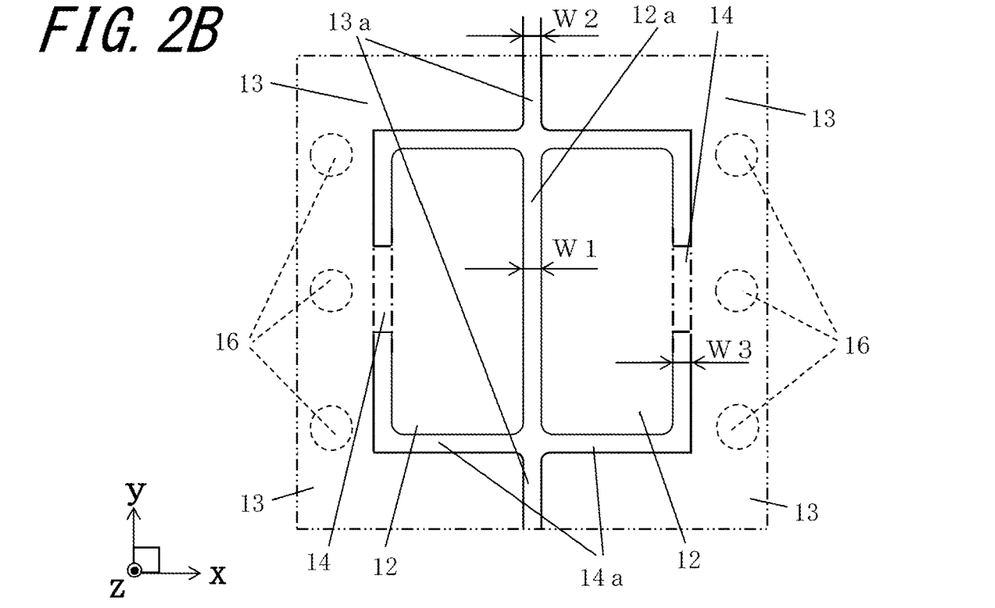
FIG. 2B is a top view in an enlarged manner of a primary portion in part IIB in FIG. 2A.
Figure 3A:
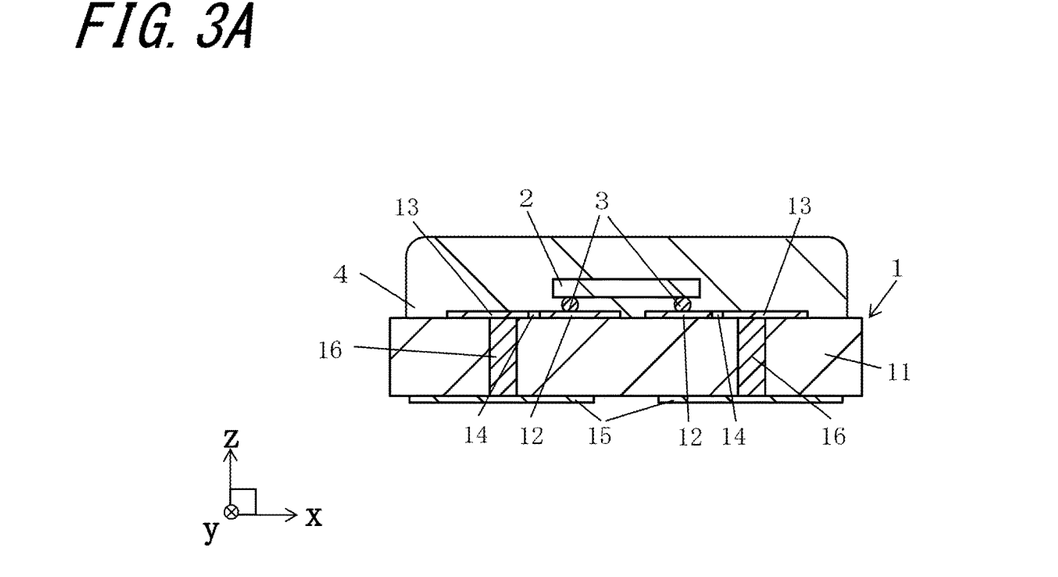
FIG. 3A is a vertical section taken along line IIIA-IIIA of the electronic device illustrated in FIG. 1A.
Figure 3B:
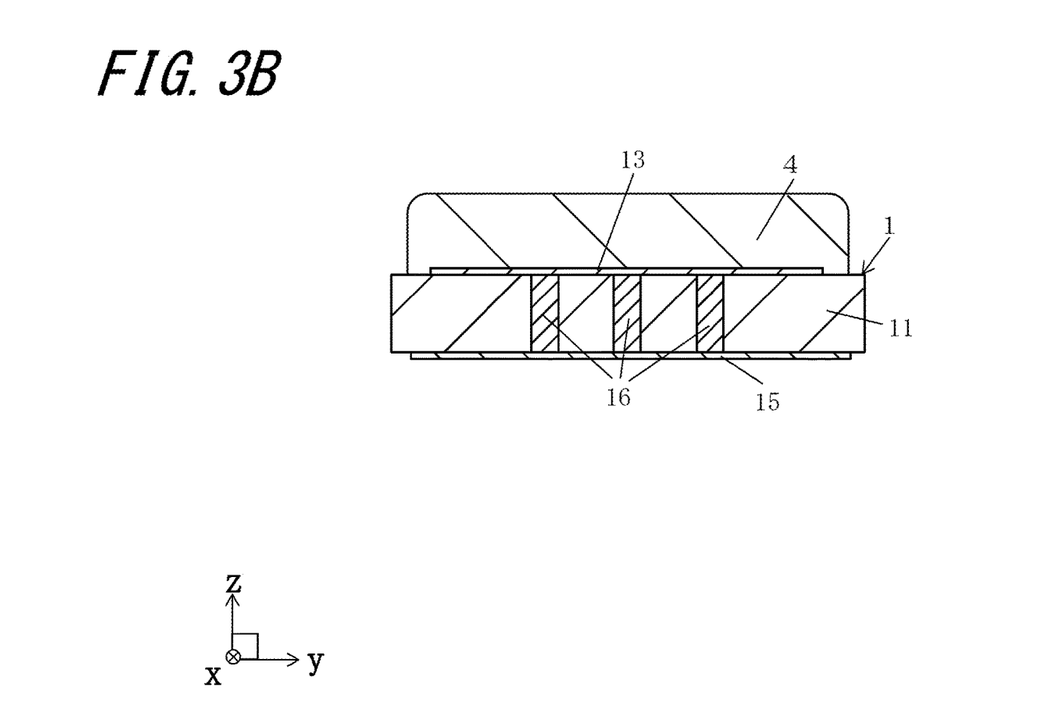
FIG. 3B is a vertical section taken along line IIIB-IIIB in FIG. 1A.

In the example illustrated in FIGS. 1A, 2A, and 2B, a region where the side surface of the via conductor 16 overlaps the plane electrode 13 in the perspective plan view is indicated by broken lines. In the example illustrated in FIG. 1B, a region where the edge portion of the connection electrode 14 and the side surface of the via conductor 16 overlap the outer electrode 15 in the perspective plan view is indicated by broken lines.

The substrate 11 has the first principal surface (in FIGS. 1A to 3B, upper surface) and the second principal surface (in FIGS. 1A to 3B, lower surface). The substrate 11 has a rectangular plate-like shape having two pairs of opposing sides (four sides) at each of the first principal surface and the second principal surface in the plan view. The substrate 11 functions as a support body for supporting the electronic component 2. The electronic component 2 is bonded and fixed onto the mount electrode 12 on the first principal surface of the substrate 11 by using a connecting member 3 such as a solder bump.

The substrate 11 may use ceramics, such as an aluminum oxide sintered body (alumina ceramic), an aluminum nitride sintered body, a mullite sintered body, or a glass-ceramic sintered body. If the substrate 11 is an aluminum oxide sintered body, a slurry is prepared by adding an appropriate organic binder and a solvent to raw-material powder of, for example, aluminum oxide ($Al_2O_3$), silicon oxide ($SiO_2$), magnesium oxide (MgO), or calcium oxide (CaO), and mixing them together. The slurry is formed in a sheet-like shape by employing a known doctor blade method or a known calendar roll method, and a ceramic green sheet is formed. Then, the ceramic green sheet is appropriately punched, a plurality of the ceramic green sheets is laminated if required, and a green body is formed. The green body is fired at high temperature (about 1600° C.), and a substrate 11 including a plurality of insulating layers is formed.

The mount electrode 12, the plane electrode 13, the connection electrode 14, the outer electrode 15, and the via conductor 16 electrically connect the electronic component 2 mounted on the mount electrode 12 with the module substrate 5. The mount electrode 12 joins the electronic-component mount substrate 1 to the electronic component 2. The outer electrode 15 joins the electronic-component mount substrate 1 to the module substrate 5.

The mount electrode 12, the plane electrode 13, and the connection electrode 14 are on the first principal surface of the substrate 11. The mount electrode 12 is on the first principal surface of the substrate 11 and sandwiches the first slit 12a. The mount electrode 12 is a pair of electrodes. The first slit 12a has a width W1 in a range from about 0.02 to about 0.2 mm. The plane electrode 13 is on the first principal surface of the substrate 11 and surrounds the mount electrode 12 in the plan view. The plane electrode 13 has the second slit 13a and is a pair of electrodes. The second slit 13a has a width W2 in a range from about 0.02 to about 0.2 mm. The connection electrode 14 is between each of the pair of mount electrodes 12 and corresponding one of the pair of plane electrodes 13, and connects the mount electrode 12 with the plane electrode 13. In the example illustrated in FIGS. 1A to 2B, the connection electrodes 14 that respectively connect the pair of mount electrodes 12 with the pair of plane electrodes 13 oppose to each other with a mount portion for the electronic component 2 interposed therebetween. The first slit 12a and the second slit 13a have linear shapes in the example illustrated in FIGS. 1A to 2B.

The outer electrode 15 is on the second principal surface of the substrate 11 opposite to the first principal surface of the substrate 11. The outer electrode 15 overlaps each of the pair of connection electrodes 14 in the perspective plan view as the example illustrated in FIG. 1B, the outer edge of the outer electrode 15 surrounds the connection electrode 14. The outer electrode 15 overlaps, for example, the entire region of the connection electrode 14 in the perspective plan view. The outer electrode 15 also overlaps a portion of each of the mount electrodes 12 and a portion of each of the plane electrodes 13 in the perspective plan view.

The via conductor 16 is disposed in the substrate 11, that is, disposed in the thickness direction of the substrate 11. The via conductor 16 connects each of the plane electrodes 13 on the first principal surface of the substrate 11 with corresponding one of the outer electrodes 15 on the second principal surface of the substrate 11. In the example illustrated in FIGS. 1A to 3B, the plane electrode 13 and the outer electrode 15 are connected by three via conductors 16.

The material of the mount electrode 12, the plane electrode 13, the connection electrode 14, the outer electrode 15, and the via conductor 16 may be, for example, metallized powder containing, as a main component, tungsten (W), molybdenum (Mo), manganese (Mn), silver (Ag), or copper (Cu). The mount electrode 12, the plane electrode 13, the connection electrode 14, and the outer electrode 15 are formed by applying a metallized paste for the mount electrode 12, the plane electrode 13, the connection electrode 14, and the outer electrode 15, for example, on the ceramic green sheet for the substrate 11 by printing such as screen printing, and firing the paste together with the ceramic green sheet for the substrate 11. Also, a through hole for the via conductor 16 is formed by punching the ceramic green sheet for the substrate 11 by using a processing method, such as punching with a die or a puncher, or laser processing; filling the through hole with the metallized paste for the via conductor 16 by printing such as screen printing; and firing the paste with the ceramic green sheet for the substrate 11. The above-described metallized paste is prepared by adding an appropriate solvent or binder to the above-described metal powder and kneading the mixture, and hence the viscosity of the mixture is adjusted to an appropriate viscosity. The metallized paste may contain glass powder or ceramic powder to increase the joining intensity with respect to the substrate 11.

Exposed surfaces of the mount electrode 12, the plane electrode 13, the connection electrode 14, and the outer electrode 15 from the substrate 11 is coated with a metal-plating layer made of, for example, nickel or gold with good corrosion resistance. Corrosion of the mount electrode 12, the plane electrode 13, the connection electrode 14, and the outer electrode 15 can be suppressed, and junction between the mount electrode 12 and the electronic component 2, connection between the mount electrode 12 and the connecting member 3, and junction between the module substrate 5 and the outer electrode 15 can be strong. For example, the exposed surfaces of the mount electrode 12, the plane electrode 13, the connection electrode 14, and the outer electrode 15 from the substrate 11 are coated sequentially with a nickel-plating layer with a thickness in a range from about 1 to about 10 µm and a gold-plating layer with a thickness in a range from about 0.1 to about 3 µm.

The metal-plating layer is not limited to the metal-plating layer including the nickel-plating layer and the gold-plating layer, and may be another metal-plating layer including a nickel-plating layer, a gold-plating layer, and a silver-plating layer, or a still another metal-plating layer including a nickel-plating layer, a palladium-plating layer, and a gold-plating layer.

For example, on the mount electrode 12 on which the electronic component 2 is mounted, the base layer including the above-described nickel-plating layer and gold-plating layer may be coated with a copper-plating layer with a thickness in a range from about 10 to about 80 µm as a metal-plating layer. Accordingly, heat of the electronic component 2 may be efficiently released through the copper-plating layer to the electronic-component mount substrate 1.

For example, on the outer electrode 15, the base layer including the above-described nickel-plating layer and gold-plating layer may be coated with a copper-plating layer with a thickness in a range from about 10 to about 80 µm as a metal-plating layer. Accordingly, heat of the electronic-component mount substrate 1 can be efficiently released through the copper-plating layer to the module substrate 5.

An electronic device can be fabricated by mounting the electronic component 2 on the mount electrode 12 on the first principal surface of the electronic-component mount substrate 1. The electronic component 2 mounted on the electronic-component mount substrate 1 is, for example, a semiconductor element, such as an integrated circuit (IC) chip or a large scale integrated (LSI) chip; a light-emitting element; a piezoelectric element, such as a crystal vibrator; or any of various sensor elements. For example, if the electronic component 2 is a flip-chip semiconductor element, the semiconductor element is mounted on the electronic-component mount substrate 1 by mechanically and electrically connecting an electrode of the semiconductor element with the mount electrode 12 via a connecting member 3, such as a solder bump, a gold bump, or electrically conductive resin (anisotropic electrically-conductive resin). For another example, if the electronic component 2 is a wire-bonding semiconductor element, the semiconductor element is mounted on the electronic-component mount substrate 1 by fixing the semiconductor element onto one of the mount electrodes 12, on which the electronic component 2 is mounted, by using a joining member, such as a low-melting brazing alloy or electrically conductive resin, and then electrically connecting an electrode of the semiconductor element with the other one of the mount electrodes 12 via a connecting member 3 such as a bonding wire. A plurality of electronic components 2 may be mounted on the electronic-component mount substrate 1, or another electronic component, such as a resistance element, a capacitance element, or a Zener diode, may be mounted on the electronic-component mount substrate 1 if required. Also, the electronic component 2 may be sealed with a sealing member 4 made of resin or glass, or a lid body made of resin, glass, ceramic, or metal if required.

Figure 4:
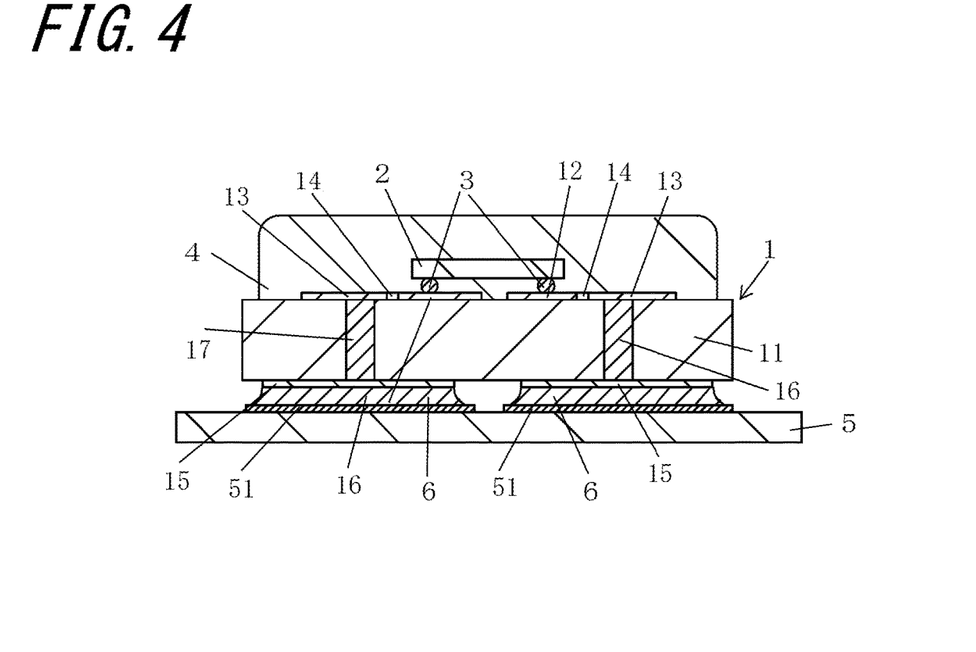
FIG. 4 is a vertical section illustrating an electronic module mounted on a module substrate using the electronic device in FIGS. 1A and 1B.

The electronic device according to this embodiment is connected to the connection pad 51 of the module substrate 5 via a joining material 6 such as solder, and forms an electronic module as the example illustrated in FIG. 4.

An electronic-component mount substrate 1 according to this embodiment includes a substrate 11 having a first principal surface and a second principal surface opposite to the first principal surface; a mount electrode 12 for mounting an electronic component 2 on the first principal surface, the mount electrode 12 having a first slit 12a and sandwiching the first slit 12a; a plane electrode 13 surrounding the mount electrode in a plan view and having a second slit 13a; a connection electrode 14 connecting the mount electrode 12 with the plane electrode 13; and an outer electrode 15 on the second principal surface. The connection electrode 14 overlaps the outer electrode 15 and an outer edge of the outer electrode 15 surrounds the connection electrode 14 in a perspective plan view. For example, when the plane electrode 13 is connected to the outer electrode 15 through a via conductor 16, transfer of heat of the via conductor 16 by a large amount to the electronic component 2 through the connection electrode 14 is suppressed, and the heat is more likely transferred to the outer electrode 15 rather than the connection electrode 14. Accordingly, a warp of the electronic-component mount substrate 1 can be suppressed, and separation of the electronic component 2 or breakage of the electronic component 2 can be suppressed.

Also, the electronic-component mount substrate 1 has a third slit 14a between the mount electrode 12 and the plane electrode 13 and the third slit 14a sandwiches the connection electrode 14. Accordingly, a heat transfer path between the mount electrode 12 and the plane electrode 13 can be decreased in size. For example, when the plane electrode 13 is connected to the outer electrode 15 through the via conductor 16, transfer of heat of the via conductor 16 by a large amount to the electronic component 2 through the connection electrode 14 can be effectively suppressed, and separation of the electronic component 2 or breakage of the electronic component 2 can be suppressed.

The connection electrode 14 is sandwiched between two third slits 14a as the example illustrated in FIGS. 2A and 2B. The third slits 14a each have a width W3 in a range from about 0.02 to about 0.2 mm like the first slit 12a and the second slit 13a.

An electronic device according to this embodiment includes the electronic-component mount substrate 1 with the above-described configuration, and an electronic component 2 mounted on the electronic-component mount substrate 1. Accordingly, electrical reliability is increased.

An electronic module according to this embodiment includes the electronic device with the above-described configuration, and a module substrate 5 to which the electronic device is connected. Accordingly, reliability is good for a long term.

The electronic-component mount substrate 1 according to this embodiment can be preferably used for a thin and high-output electronic device. Reliability of the electronic-component mount substrate 1 can be increased. For example, if a light-emitting element is mounted as the electronic component 2, the electronic-component mount substrate 1 can be preferably used as an electronic-component mount substrate 1 for a thin and high-luminance light-emitting device.

Second Embodiment

An electronic device according to a second embodiment of the present invention is described next with reference to FIGS. 5A to 7B.

The electronic device according to the second embodiment of the present invention differs from the electronic device of the above-described embodiment in that the via conductor 16 is at a position separated from an imaginary line N connecting a center portion of the mount portion with the connection electrode 14 and separated from the second slit 13a.

Figure 5A:
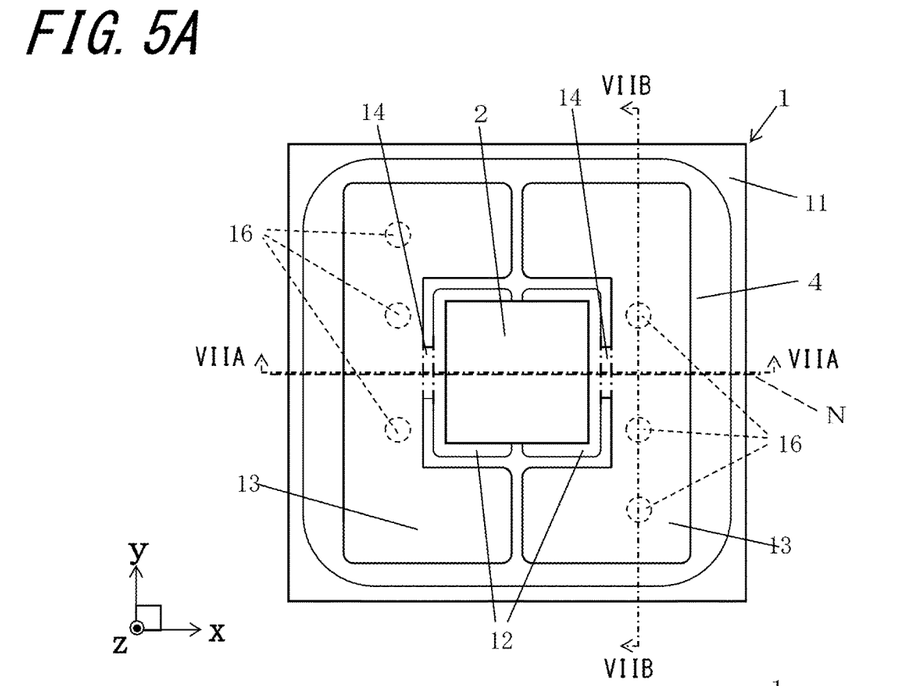
FIG. 5A is a top view illustrating an electronic device according to a second embodiment of the present invention.
Figure 5B:
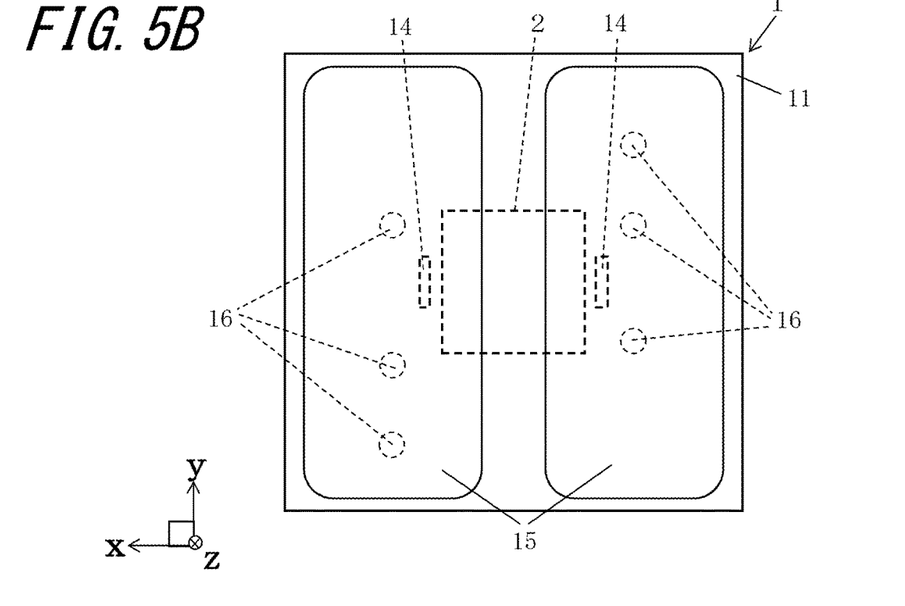
FIG. 5B is a bottom view of FIG. 5A.
Figure 6:
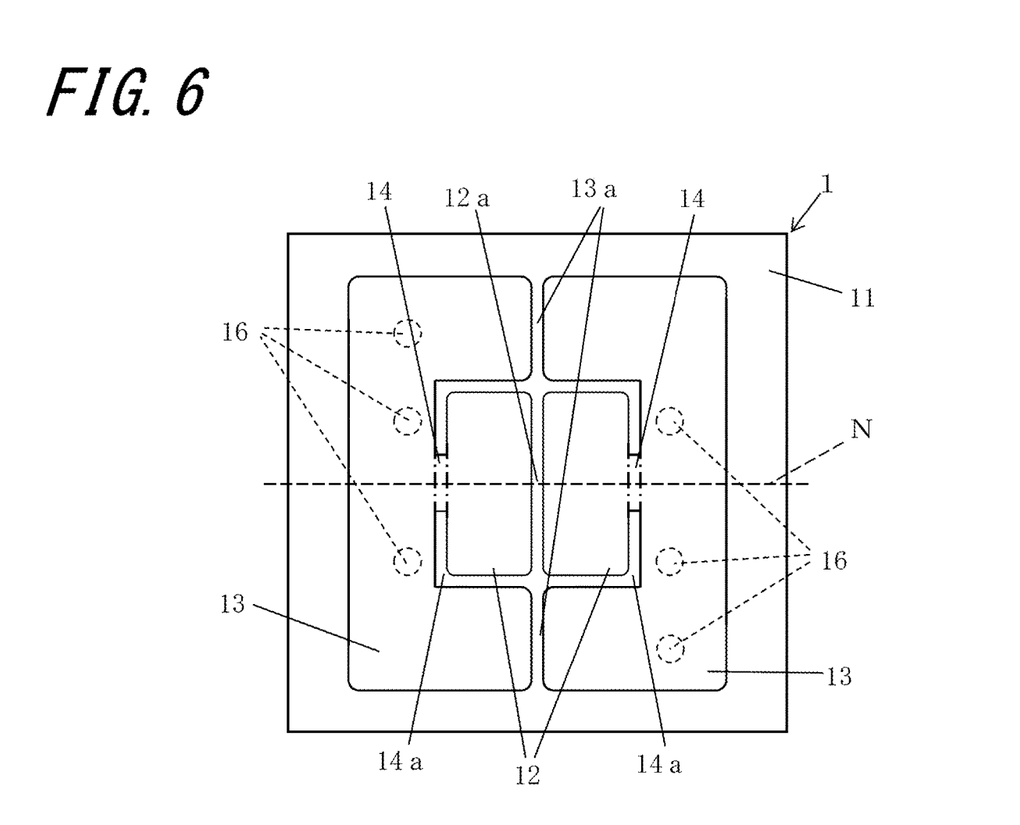
FIG. 6 is a top view illustrating an electronic-component mount substrate in the electronic device in FIGS. 5A and 5B.
Figure 7A:
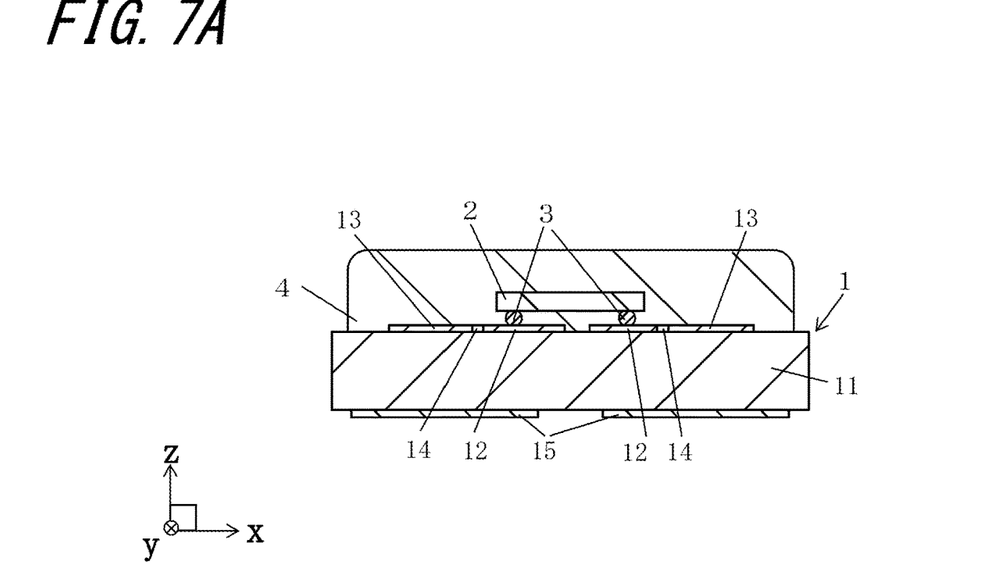
FIG. 7A is a vertical section taken along line VIIA-VIIA of the electronic device illustrated in FIG. 5A.
Figure 7B:
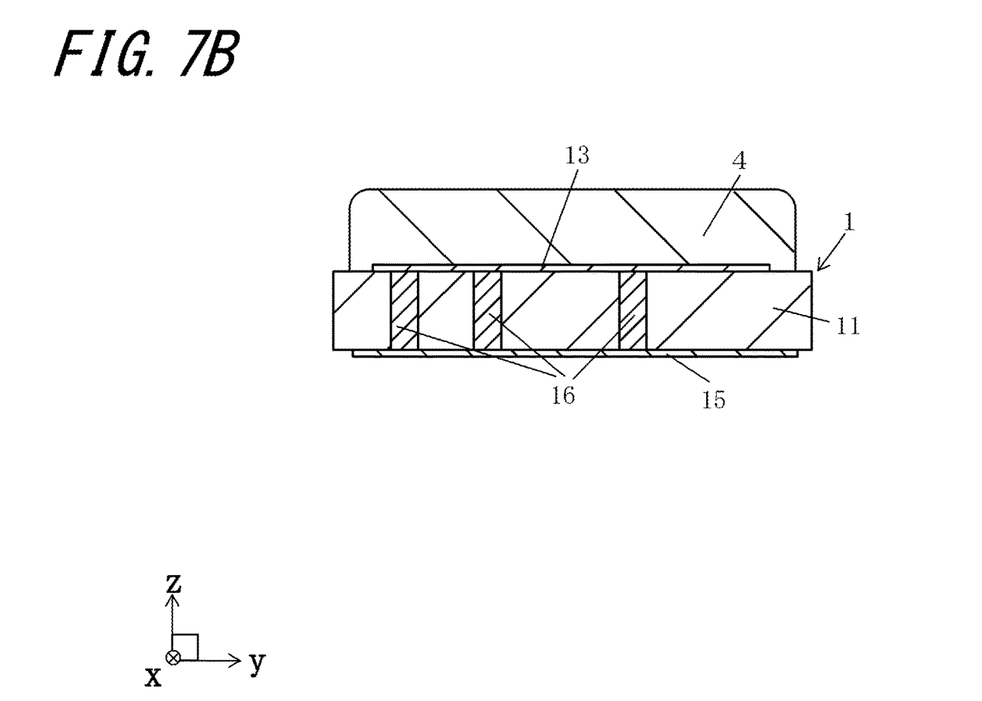
FIG. 7B is a vertical section taken along line VIIB-VIIB in FIG. 5A.

In the example illustrated in FIGS. 5A and 6, a region where the side surface of the via conductor 16 overlaps the plane electrode 13 in a perspective plan view is indicated by broken lines. In the example illustrated in FIG. 5B, a region where the edge portion of the connection electrode 14 and the side surface of the via conductor 16 overlap the outer electrode 15 in the perspective plan view is indicated by broken lines.

The center portion of the mount portion is the center of the region where the electronic component 2 is mounted. In the electronic-component mount substrate 1 according to the second embodiment, the electronic component 2 is mounted at the center portion of the substrate 11 as the example illustrated in FIGS. 5A, 5B, 7A, and 7B, and hence the center portion of the mount portion is the center of the substrate 11. In the example illustrated in FIGS. 5A to 6, the connection electrodes 14 that respectively connect the mount electrodes 12 with the plane electrodes 13 oppose to each other with the mount portion for the electronic component 2 interposed therebetween. The imaginary line N connects the connection electrodes 14 opposite to each other.

With the electronic-component mount substrate 1 according to the second embodiment of the present invention, similarly to the first embodiment, for example, when the plane electrode 13 is connected to the outer electrode 15 through the via conductor 16, transfer of heat of the via conductor 16 by a large amount to the electronic component 2 through the connection electrode 14 is suppressed, and heat is more likely transferred to the outer electrode 15 rather than the connection electrode 14. Accordingly, a warp of the electronic-component mount substrate 1 can be suppressed, and separation of the electronic component 2 or breakage of the electronic component 2 can be suppressed.

Also, the via conductor 16 connects the plane electrode 13 with the outer electrode 15, the via conductor 16 overlaps the plane electrode 13 and the outer electrode 15 in the perspective plan view, and the via conductor 16 is at a position separated from the imaginary line N connecting the center portion of the mount portion for mounting the electronic component 2 with the connection electrode 14. Hence, the via conductor 16 is more separated from the connection electrode 14 being a heat transfer path between the mount electrode 12 and the plane electrode 13. Transfer of heat of the via conductor 16 by a large amount to the electronic component 2 through the connection electrode 14 can be effectively suppressed, and separation of the electronic component 2 or breakage of the electronic component 2 can be suppressed.

Also, as the example illustrated in FIGS. 5A to 7B, if a plurality of via conductors 16 is point-symmetrically arranged while sandwiching the mount portion for the electronic component 2, that is, if the plurality of via conductors 16 is disposed not to be shifted toward one lateral surface of the substrate 11, shift of heat of the via conductors 16 toward one side of the substrate 11 is suppressed. Accordingly, a warp of the electronic-component mount substrate 1 can be suppressed, and separation of the electronic component 2 or breakage of the electronic component 2 can be suppressed. The via conductors 16 include three via conductors 16 on each of the left side and right side of the substrate 11 in the perspective plan view in the example illustrated in FIGS. 5A to 7B, similarly to the electronic-component mount substrate 1 according to the first embodiment. In the electronic-component mount substrate 1 according to the second embodiment, two via conductors 16 are disposed above the imaginary line N and one via conductor 16 is below the imaginary line N, on the left side of the substrate 11. Also, one via conductor 16 is disposed above the imaginary line N, and two via conductors 16 are disposed below the imaginary line N, on the right side of the substrate 11. The via conductors 16 are disposed in a manner that the numbers of via conductors 16 are equivalent to each other between regions diagonally opposite to each other when the electronic-component mount substrate 1 is divided into four in a plan view.

The electronic-component mount substrate 1 according to the second embodiment can be preferably used for a thin and high-output electronic device. Reliability of the electronic-component mount substrate 1 can be increased. For example, if a light-emitting element is mounted as the electronic component 2, the electronic-component mount substrate 1 can be preferably used as an electronic-component mount substrate 1 for a thin and high-luminance light-emitting device.

The electronic-component mount substrate 1 according to the second embodiment can be fabricated by using a manufacturing method similar to that of the electronic-component mount substrate 1 according to the above-described first embodiment.

Third Embodiment

An electronic device according to a third embodiment of the present invention is described next with reference to FIGS. 8A, 8B, and 9.

The electronic device according to the third embodiment of the present invention differs from the electronic device according to any of the above-described embodiments in that the connection electrode 14 includes a plurality of connection electrodes 14 that connect a single mount electrode 12 with a single plane electrode 13. In the example illustrated in FIGS. 8A and 8B, three connection electrodes 14 are between a single mount electrode 12 and a single plane electrode 13.

Figure 8A:
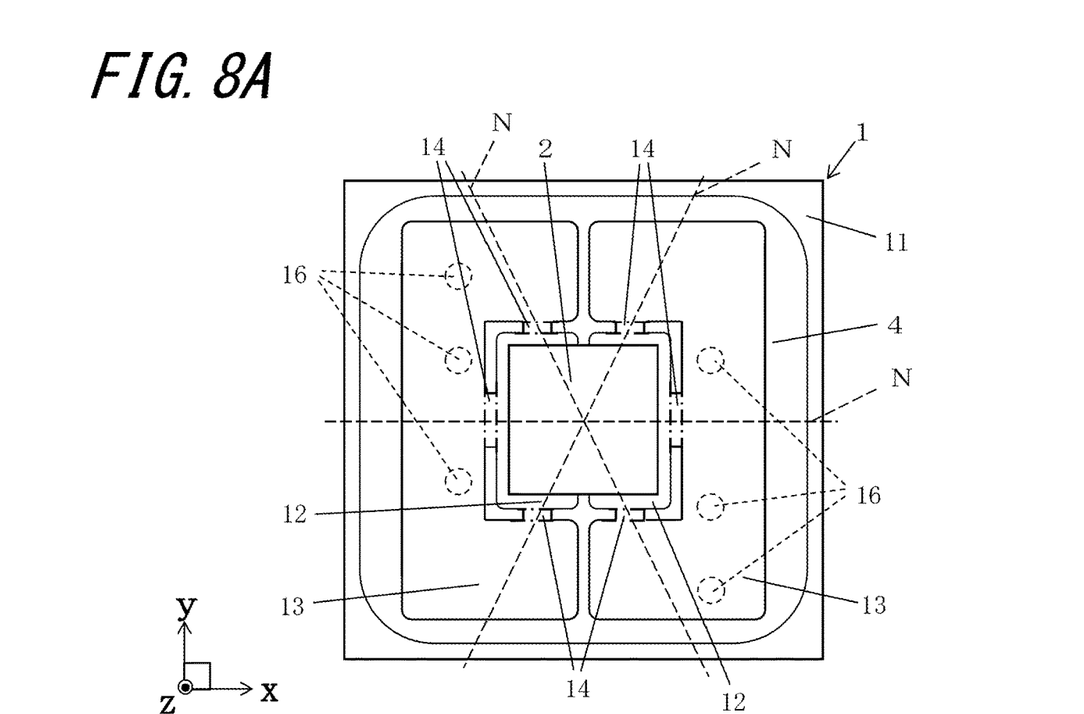
FIG. 8A is a top view illustrating an electronic device according to a third embodiment of the present invention.
Figure 8B:
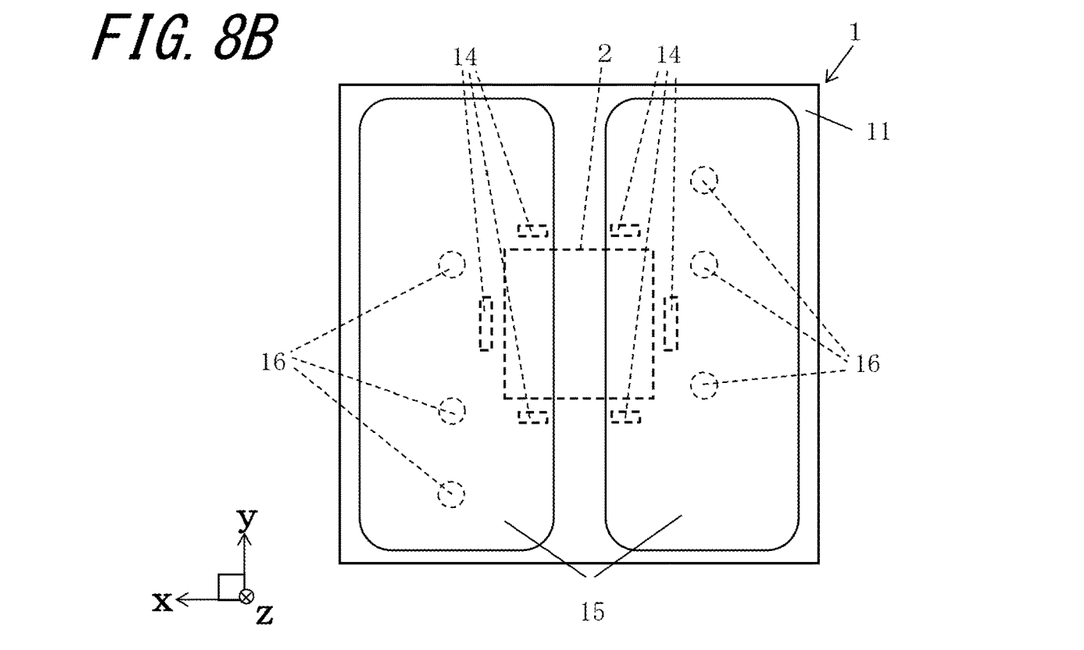
FIG. 8B is a bottom view of FIG. 8A.
Figure 9:
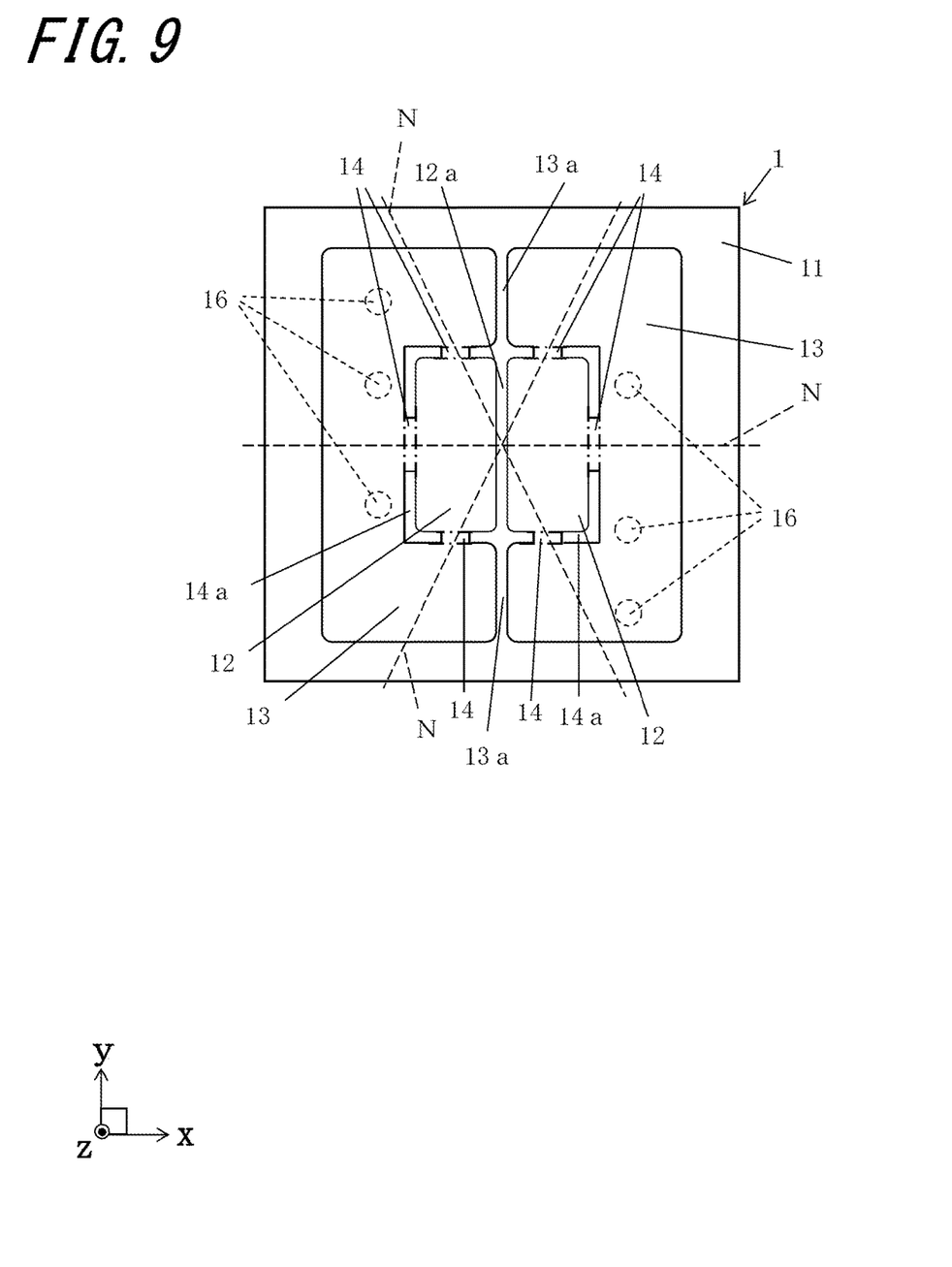
FIG. 9 is a top view illustrating an electronic-component mount substrate in the electronic device in FIGS. 8A and 8B.

In the example illustrated in FIGS. 8A and 9, a region where the side surface of the via conductor 16 overlaps the plane electrode 13 in a perspective plan view is indicated by broken lines. In the example illustrated in FIG. 8B, a region where the edge portion of the connection electrode 14 and the side surface of the via conductor 16 overlap the outer electrode 15 in the perspective plan view is indicated by broken lines.

With the electronic-component mount substrate 1 according to the third embodiment of the present invention, similarly to the first embodiment, transfer of heat of the via conductor 16 by a large amount to the electronic component 2 through the connection electrode 14 is suppressed, and the heat is more likely transferred to the outer electrodes 15 rather than the connection electrodes 14. Accordingly, a warp of the electronic-component mount substrate 1 can be suppressed, and separation of the electronic component 2 or breakage of the electronic component 2 can be suppressed.

If the via conductor 16 is at a position separated from the imaginary line N connecting the center portion of the mount portion for mounting the electronic component 2 with the connection electrode 14, the via conductor 16 is more separated from the connection electrode 14 being a heat transfer path between the mount electrode 12 and the plane electrode 13. Transfer of heat of the via conductor 16 by a large amount to the electronic component 2 through the connection electrode 14 can be effectively suppressed, and separation of the electronic component 2 or breakage of the electronic component 2 can be suppressed.

The electronic-component mount substrate 1 according to the third embodiment can be preferably used for a thin and high-output electronic device. Reliability of the electronic-component mount substrate 1 can be increased. For example, if a light-emitting element is mounted as the electronic component 2, the electronic-component mount substrate 1 can be preferably used as an electronic-component mount substrate 1 for a thin and high-luminance light-emitting device.

The electronic-component mount substrate 1 according to the third embodiment can be fabricated by using a manufacturing method similar to that of the electronic-component mount substrate 1 according to the above-described first embodiment.

Fourth Embodiment

An electronic device according to a fourth embodiment of the present invention is described next with reference to FIGS. 10A, 10B, and 11.

The electronic device according to the fourth embodiment of the present invention differs from the electronic device according to any of the above-described embodiments in that the substrate 11 includes a plurality of insulating layers 11a. The substrate 11 includes two insulating layers 11a in the example in FIG. 11.

Figure 10A:
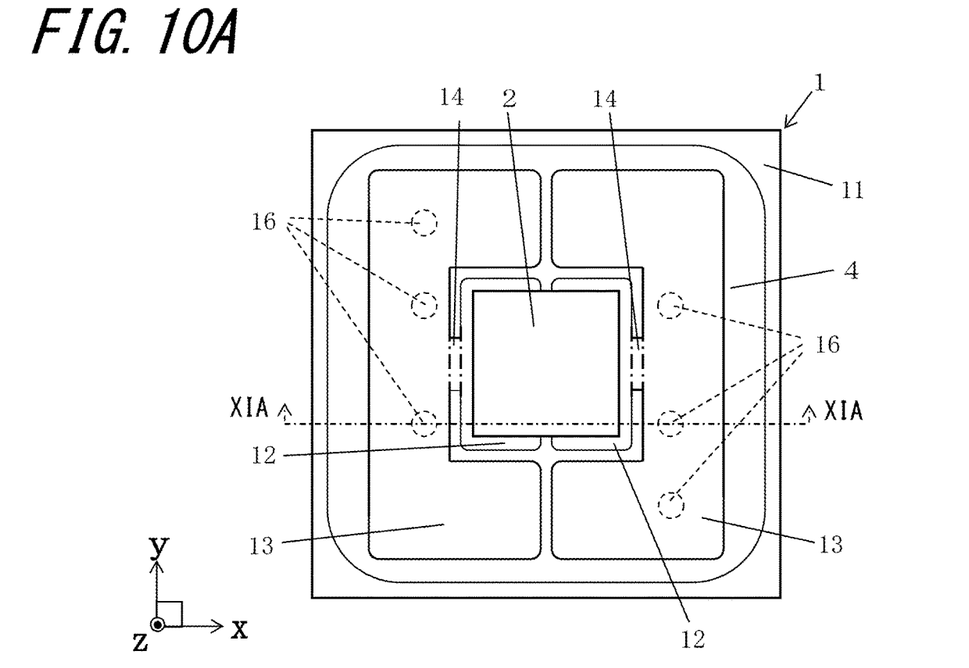
FIG. 10A is a top view illustrating an electronic device according to a fourth embodiment of the present invention.

In the example illustrated in FIG. 10A, a region where the side surface of the via conductor 16 overlaps the plane electrode 13 in a perspective plan view is indicated by broken lines. In the example illustrated in FIG. 10B, a region where the edge portion of the connection electrode 14 and the side surface of the via conductor 16 overlap the outer electrode 15 in the perspective plan view is indicated by broken lines.

With the electronic-component mount substrate 1 according to the fourth embodiment of the present invention, similarly to the first embodiment, transfer of heat of the via conductor 16 by a large amount to the electronic component 2 through the connection electrode 14 is suppressed, and the heat is more likely transferred to the outer electrode 15 rather than the connection electrode 14. Accordingly, a warp of the electronic-component mount substrate 1 can be suppressed, and separation of the electronic component 2 or breakage of the electronic component 2 can be suppressed.

Figure 10B:
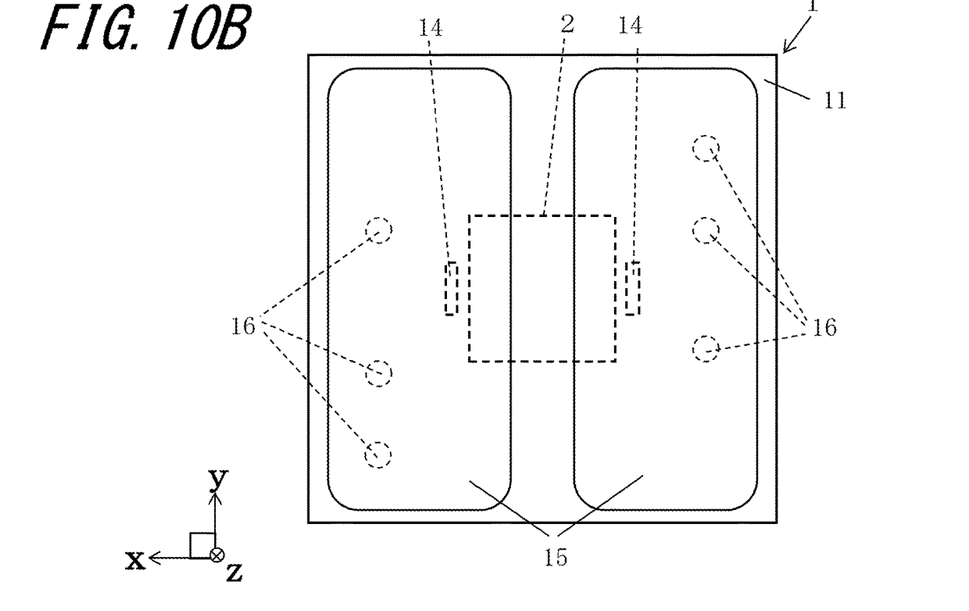
FIG. 10B is a bottom view of FIG. 10A.
Figure 11:
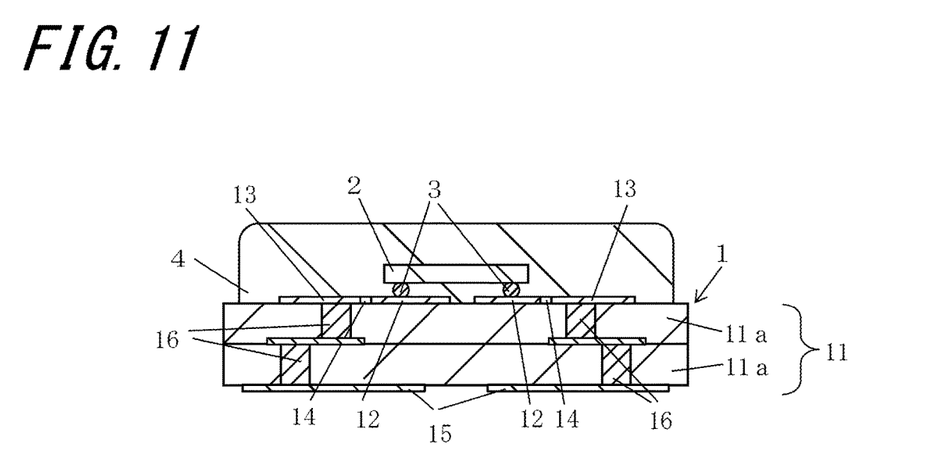
FIG. 11 is a vertical section taken along line XIA-XIA of the electronic device illustrated in FIG. 10A.

As the example illustrated in FIGS. 10A, 10B, and 11, the position of a via conductor 16 at the first principal surface of the substrate 11 may be shifted from the position of the via conductor 16 at the second principal surface of the substrate 11 in a plan view. The via conductor 16 at the first principal surface of the substrate 11 and the via conductor 16 at the second principal surface of the substrate 11 are made of a material or made by a manufacturing method similar to that of the mount electrode 12, the plane electrode 13, and the connection electrode 14, and the via conductors 16 are electrically connected to each other by wiring in the substrate 11. If the via conductor 16 at the second principal surface is nearer to the outer periphery of the substrate 11 than the via conductor 16 at the first principal surface, that is, at a position in a region separated from the mount electrode 12 in the perspective plan view, concentration of heat at the center side of the substrate 11 can be suppressed, and a warp of the electronic-component mount substrate 1 can be suppressed. Accordingly, separation of the electronic component 2 or breakage of the electronic component 2 can be suppressed.

The electronic-component mount substrate 1 according to the fourth embodiment can be preferably used for a thin and high-output electronic device. Reliability of the electronic-component mount substrate 1 can be increased. For example, if a light-emitting element is mounted as the electronic component 2, the electronic-component mount substrate 1 can be preferably used as an electronic-component mount substrate 1 for a thin and high-luminance light-emitting device.

The electronic-component mount substrate 1 according to the fourth embodiment can be fabricated by using a manufacturing method similar to that of the electronic-component mount substrate 1 according to the above-described first embodiment.

The present invention is not limited to the examples of the above-described embodiments, and various modifications can be made. For example, an electronic-component mount substrate 1 may have chamfered portions or arcuate cut portions at corner portions of the substrate 11 in the thickness direction of the substrate 11.

While the mount electrode 12, the plane electrode 13, the connection electrode 14, and the outer electrode 15 are formed by co-firing in the above-described embodiments, a metal layer formed by known post-firing or thin-film forming may be employed. With this configuration, the electronic-component mount substrate 1 and the electronic device can have good positional accuracy.

While the three via conductors 16 connect a single mount electrode 12 with a single outer electrode 15 in the plan view in the electronic-component mount substrate 1 according to any one of the first to fourth embodiments, four or more via conductors 16 may connect the single mount electrode 12 and the single outer electrode 15.

While the substrate 11 is formed of a single insulating layer or two insulating layers in the above-described example, the substrate 11 may be formed of three or more insulating layers.

The configurations of the electronic-component mount substrates 1 according to the first to fourth embodiments may be combined. For example, in the electronic-component mount substrate 1 according to the fourth embodiment, a plurality of connection electrodes 14 may be disposed between a single mount electrode 12 and a single plane electrode 13.

What is claimed is:

1. An electronic-component mount substrate, comprising:
   a substrate comprising a first principal surface and a second principal surface opposite to the first principal surface;
   a mount electrode for mounting an electronic component on the first principal surface, the mount electrode comprising a first slit and sandwiching the first slit;
   a plane electrode surrounding the mount electrode in a plan view and comprising a second slit;
   a connection electrode connecting the mount electrode with the plane electrode; and
   an outer electrode on the second principal surface,
   wherein the connection electrode overlaps the outer electrode and an outer edge of the outer electrode surrounds the connection electrode in a perspective plan view.

2. The electronic-component mount substrate according to claim 1, comprising:
   a third slit between the mount electrode and the plane electrode, wherein the third slit sandwiches the connection electrode.

3. The electronic-component mount substrate according to claim 1, further comprising:
a via conductor connecting the plane electrode with the outer electrode,
wherein the via conductor overlaps the plane electrode and the outer electrode in the perspective plan view, and is at a position separated from an imaginary line connecting a center portion of a mount portion for mounting the electronic component and the connection electrode.

4. The electronic-component mount substrate according to claim 3, wherein the via conductor is point-symmetrically arranged about the mount portion.

5. An electronic device, comprising:
the electronic-component mount substrate according to claim 1; and
an electronic component mounted on the electronic-component mount substrate.

6. An electronic module, comprising:
the electronic device according to claim 5; and
a module substrate with the electronic device connected thereto.

7. The electronic-component mount substrate according to claim 2, further comprising:
a via conductor connecting the plane electrode with the outer electrode,
wherein the via conductor overlaps the plane electrode and the outer electrode in the perspective plan view, and is at a position separated from an imaginary line connecting a center portion of a mount portion for mounting the electronic component and the connection electrode.

8. The electronic-component mount substrate according to claim 7, wherein the via conductor is point-symmetrically arranged about the mount portion.

* * * * *